(12) United States Patent
Miyatake

(10) Patent No.: US 9,243,952 B2
(45) Date of Patent: Jan. 26, 2016

(54) LIGHT-RECEIVING DEVICE, LIGHT RECEIVER USING SAME, AND METHOD OF FABRICATING LIGHT-RECEIVING DEVICE

(71) Applicant: FUJITSU LIMITED, Kawasaki-shi, Kanagawa (JP)

(72) Inventor: Tetsuya Miyatake, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/259,488

(22) Filed: Apr. 23, 2014

(65) Prior Publication Data

US 2014/0231628 A1 Aug. 21, 2014

Related U.S. Application Data

(62) Division of application No. 13/439,351, filed on Apr. 4, 2012.

(30) Foreign Application Priority Data

Jun. 10, 2011 (JP) ................. 2011-130684

(51) Int. Cl.
*H01L 31/0224* (2006.01)
*G01J 1/44* (2006.01)
(Continued)

(52) U.S. Cl.
CPC ............... *G01J 1/44* (2013.01); *H01L 31/105* (2013.01); *H01L 31/1844* (2013.01); *G01J 2001/446* (2013.01); *H01L 2924/0002* (2013.01); *Y02E 10/544* (2013.01)

(58) Field of Classification Search
CPC ............ H01L 27/14636; H01L 27/1464; H01L 27/1463; H01L 27/14618
USPC ........................................ 257/443
See application file for complete search history.

(56) References Cited

U.S. PATENT DOCUMENTS

2002/0000510 A1* 1/2002 Matsuda ............... H01L 31/105
  250/214.1
2005/0184357 A1* 8/2005 Chiba ................. H01L 27/0641
  257/531
(Continued)

FOREIGN PATENT DOCUMENTS

JP 62-244160 10/1987
JP 02-239674 9/1990
(Continued)

OTHER PUBLICATIONS

U.S. Notice of Allowance mailed Feb. 24, 2014 in related U.S. Appl. No. 13/439,351.
(Continued)

*Primary Examiner* — Fernando L Toledo
*Assistant Examiner* — Lawrence-Linh T Nguyen
(74) *Attorney, Agent, or Firm* — Staas & Halsey LLP

(57) ABSTRACT

An apparatus includes a flip-chip semiconductor substrate, a light detection element configured to be formed over the flip-chip semiconductor substrate and to have a laminate structure including a first semiconductor layer of a first-conductive-type, a light-absorption layer formed over the first semiconductor layer, and a second semiconductor layer of a second-conductive-type formed over the light-absorption layer, an inductor configured to be connected to the light detection element over the flip-chip semiconductor substrate, an output electrode for bump connection configured to output a current generated by the light detection element through the inductor, a bias electrode for bump connection configured to apply a bias voltage to the light detection element through a bias electrode, and a line configured to cause a metal line of the inductor and the light detection element to be connected to the output electrode or the bias electrode.

2 Claims, 17 Drawing Sheets

(51) Int. Cl.
*H01L 31/105* (2006.01)
*H01L 31/18* (2006.01)

(56) References Cited

U.S. PATENT DOCUMENTS

| 2009/0051497 | A1* | 2/2009 | Miyaso | 340/10.4 |
|---|---|---|---|---|
| 2010/0260504 | A1 | 10/2010 | Takahara | |

FOREIGN PATENT DOCUMENTS

| JP | 7-250035 | 9/1995 |
|---|---|---|
| JP | 2002-050786 | 2/2002 |
| JP | 2003-179146 | 6/2003 |
| JP | 2005-236119 | 9/2005 |
| JP | 2010-251851 | 11/2010 |
| JP | 2010-267647 | 11/2010 |

OTHER PUBLICATIONS

U.S. Office Action mailed Aug. 5, 2013 in related U.S. Appl. No. 13/439,351.
U.S. Restriction Requirement mailed Jun. 12, 2013 in related U.S. Appl. No. 13/439,351.
U.S. Appl. No. 13/439,351, filed Apr. 4, 2012, Tetsuya Miyatake, Fujitsu Limited.
Japanese Office Action mailed Feb. 3, 2015 in related Japanese Application No. 2011-130684.

* cited by examiner

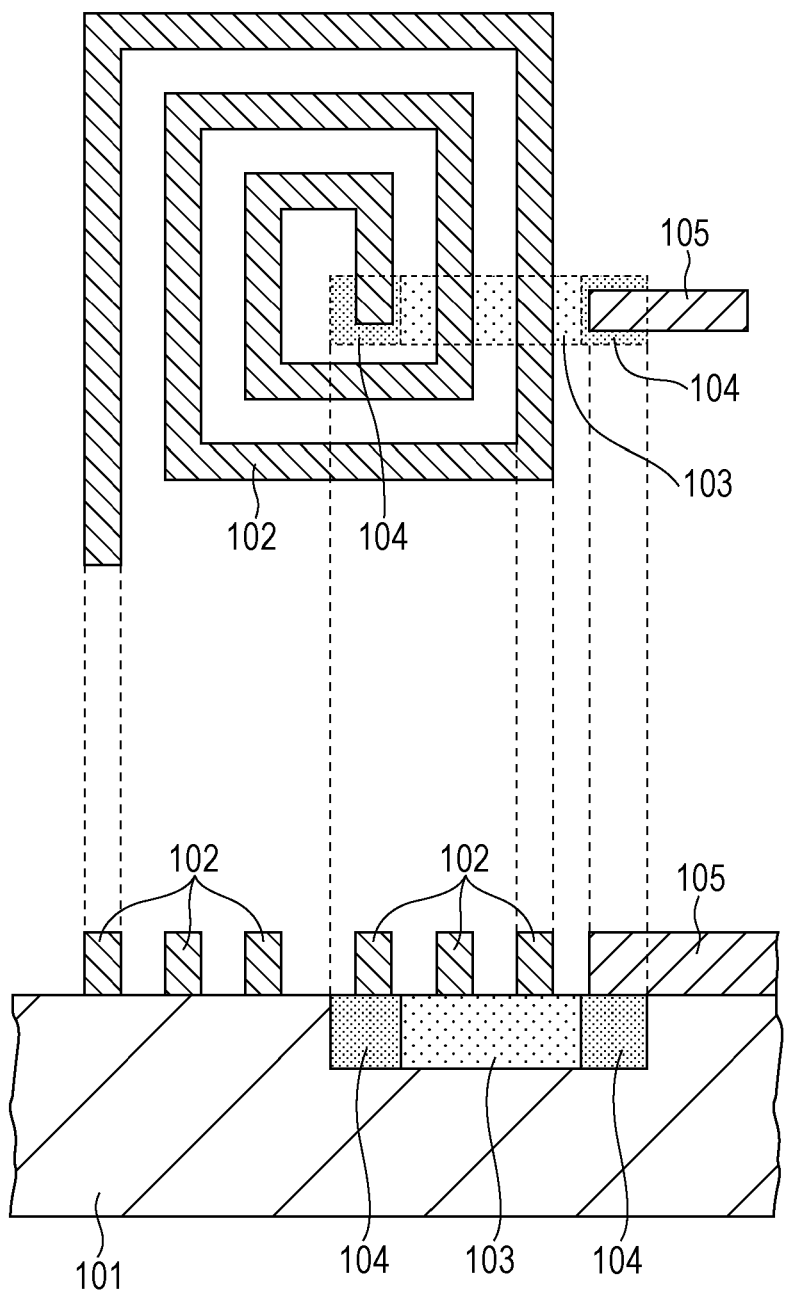

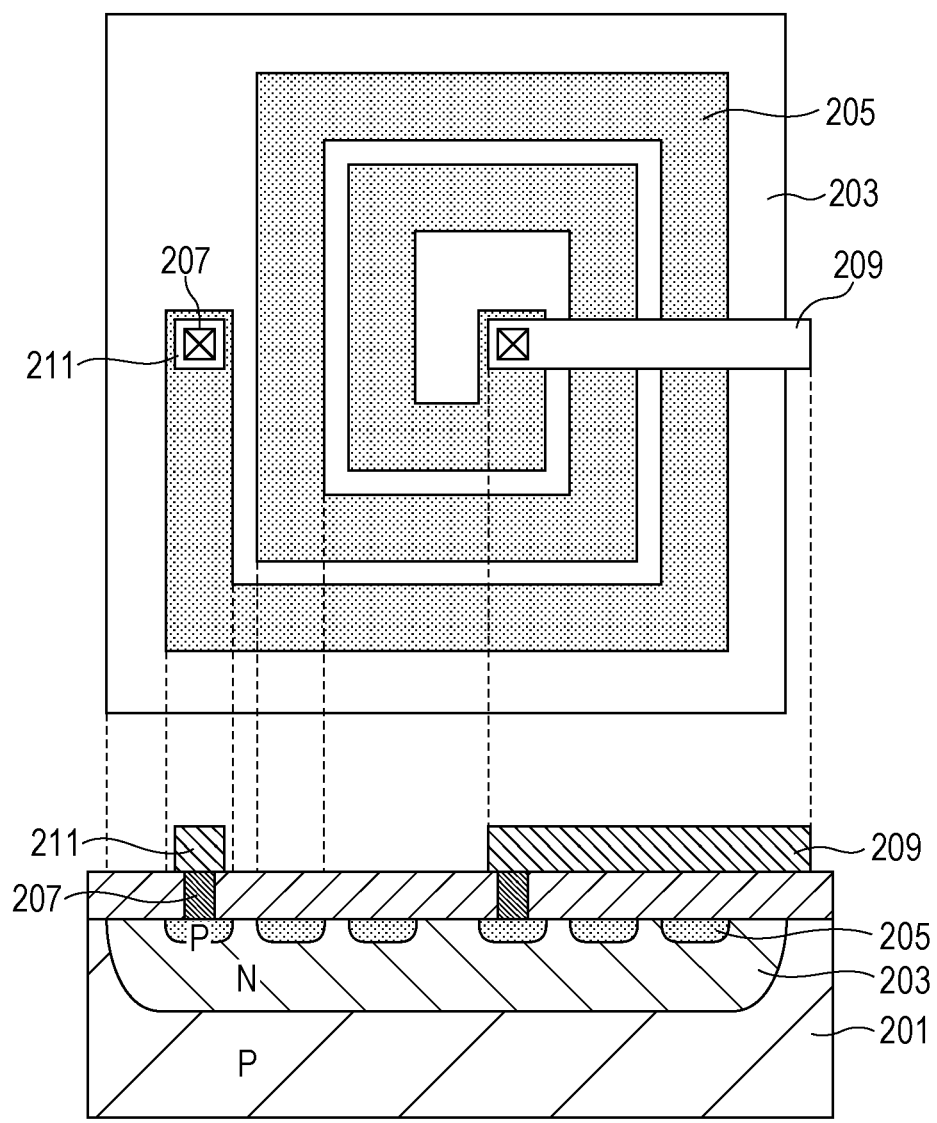

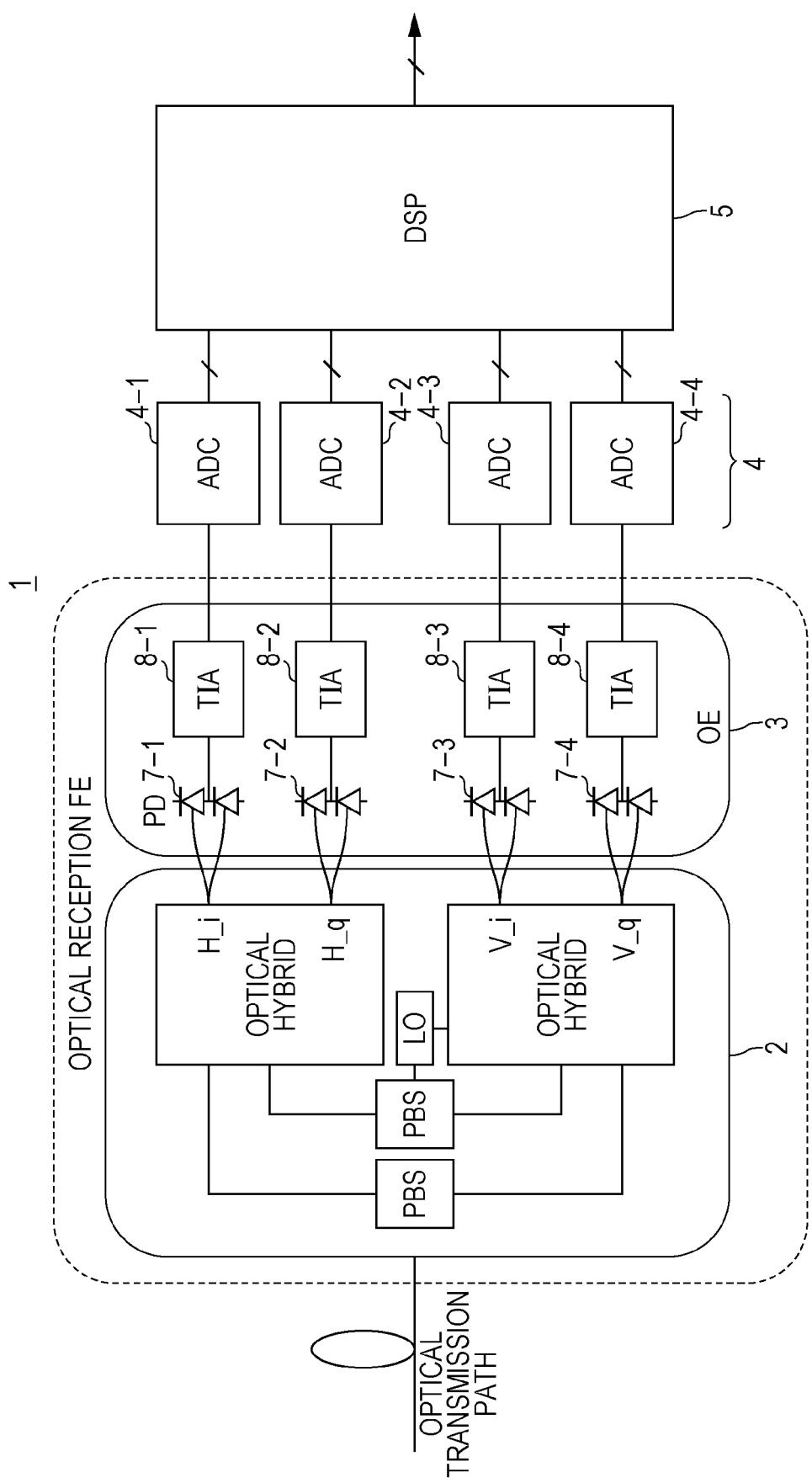

FIG. 5A
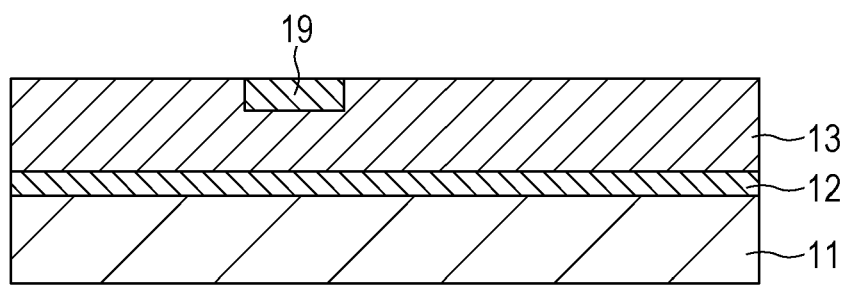
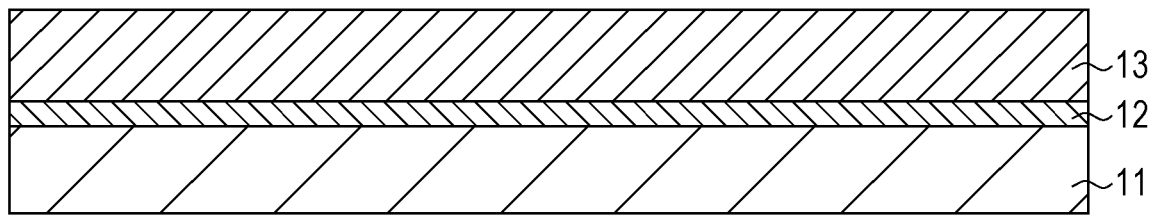

FIG. 5B
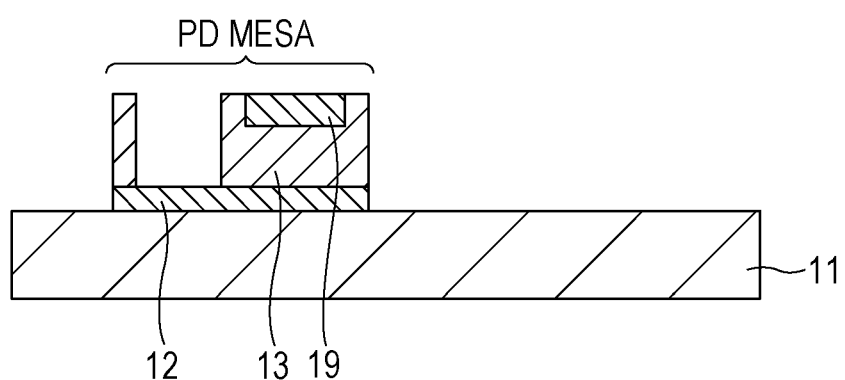
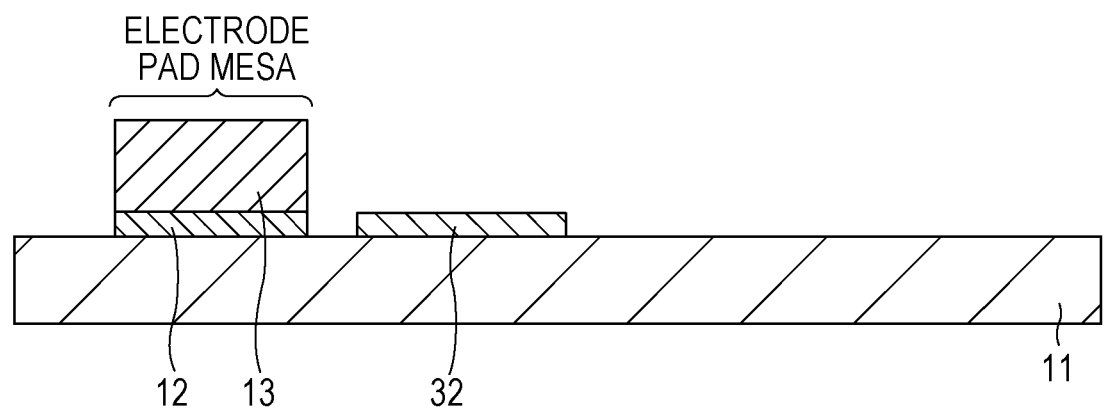

FIG. 5C
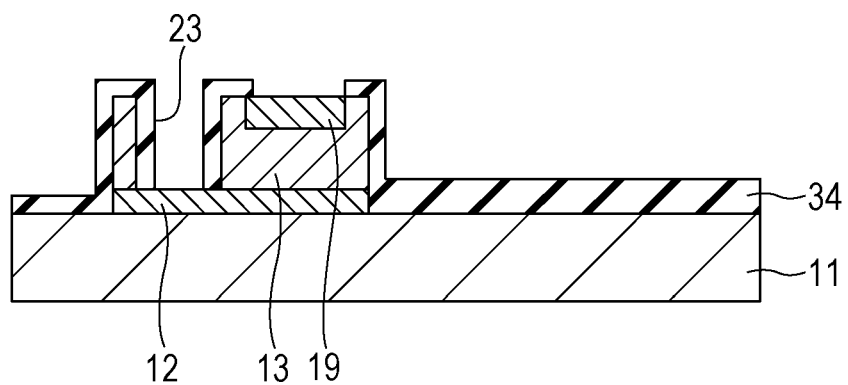
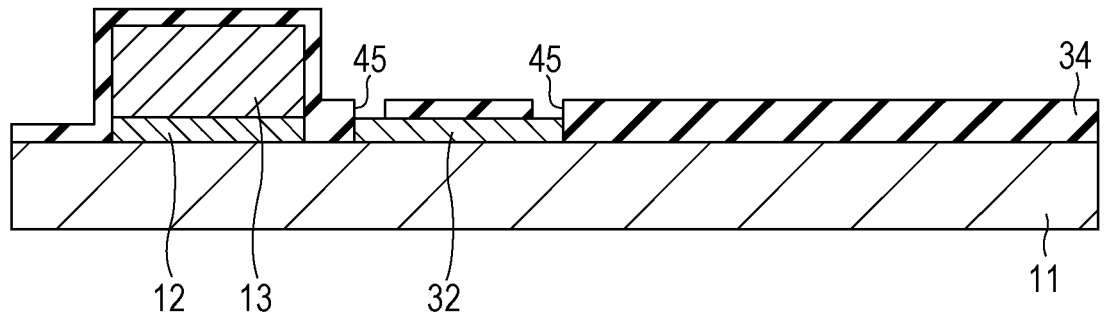

FIG. 5D
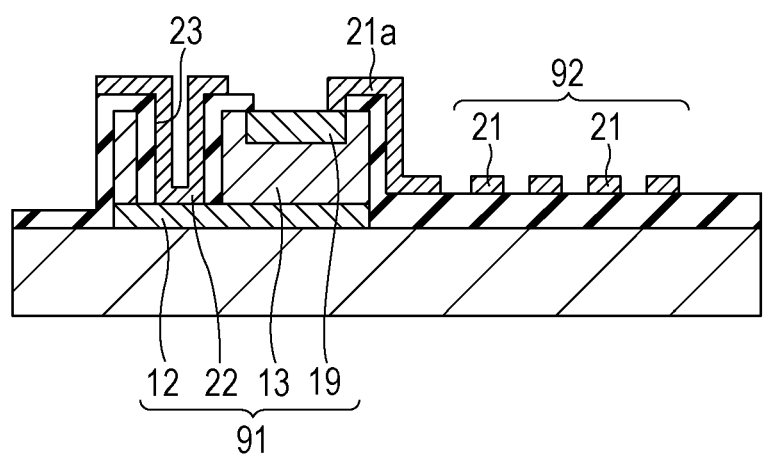
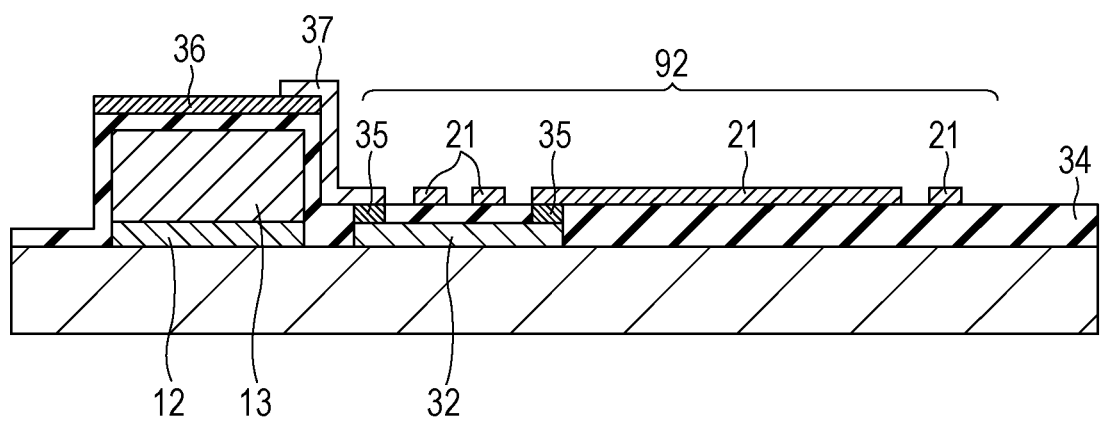

LIGHT-RECEIVING DEVICE, LIGHT RECEIVER USING SAME, AND METHOD OF FABRICATING LIGHT-RECEIVING DEVICE

CROSS-REFERENCE TO RELATED APPLICATION

This application is a divisional application of U.S. patent application Ser. No. 13/439,351, filed Apr. 4, 2012, the disclosure of which is herein incorporated in its entirety by reference. This application claims the priority benefit of Japanese Application No. 2011-130684, filed Jun. 10, 2011, the disclosure of which is herein incorporated in its entirety by reference.

FIELD

The embodiments discussed herein are related to a light-receiving device, a light receiver using the light-receiving device, and a method of fabricating the light-receiving device.

BACKGROUND

In recent years, a demand for a high-speed large-capacity (high-density) data transmission technique has been increased in a field of HPC (High Performance Computing) of high-end servers and super computers. However, in general electric transmission techniques, increase of speed and capacity has limitations and it may be difficult to realize data transmission capability (in terms of speed and a bandwidth) requested by HPC systems. As a breakthrough technique for limitation of the electric transmission techniques, an optical interconnect technique for transmitting data using light has been drawing the attention.

A photodiode of a receiver used in a high-speed optical interconnect technique preferably has a light-receiving diameter which is formed as large as possible in terms of optical connection to an optical transmission path (an optical fiber, a polymer optical waveguide, and the like). However, a photodiode (hereinafter referred to as a "PD" where appropriate) having a large light-receiving diameter has large capacitance in proportion to a light-receiving area, and therefore, the photodiode does not respond to a high-speed signal.

As a method of expanding a band of such a PD having a large light-receiving diameter, peaking using an inductor has been used. An optical electric (OE) converter included in a frontend of a light receiver includes a PD which converts a component of incident light into a current and a trans-impedance amplifier (TIA) which converts a micro current generated in the PD into a voltage. However, it is difficult to form the PD and the TIA in the same process on the same substrate.

When the PD and the TIA are connected to each other using a bonding wire, the bonding wire may be used as a peaking inductor. However, it is difficult to control an inductance of the bonding wire and speeding up has limitations. This is because, as a frequency becomes high, impedance increases, and high-frequency signals are difficult to pass.

In the high-speed optical interconnect, PD chips and a TIA chip are connected to each other through transmission paths by flip-chip implementation. However, it is difficult to ensure physical spaces for implementing inductors corresponding to PDs in the transmission paths. Therefore, the inductors are preferably formed in the PD chips.

Here, a technique of forming an inductor making use of a diffusion region included in a semiconductor device has been known. Related techniques are disclosed in Japanese Laid-open Patent Publication Nos. 62-244160 and 2003-179146, for example.

In FIG. 1A, an end portion of an inductor line 102 disposed on a resistive layer 103 and an end portion of a metal line 105 connected to a transistor, are connected to an n+ type diffusion layer 104 which is formed in a semiconductor substrate 101. The n+ diffusion layer 104 enables ohmic contact between the inductor line 102 and the resistive layer 103 and ohmic contact between the metal line 105 and the resistive layer 103. In FIG. 1B, a p-type diffusion layer 205 is formed in a spiral manner in an N-well 203 included in a silicon substrate 201 so as to form an inductor, and the inductor is connected to lines 209 and 211 through via contacts 207.

However, in a general PD process, a PIN (p-intrinsic-n) configuration is formed by epitaxial grown, and therefore, the general PD process does not include an injection process. When the methods illustrated in FIGS. 1A and 1B are employed in generation of an inductor of a PD, an injection process is additionally performed.

SUMMARY

According to an aspect of the invention, an apparatus includes a flip-chip semiconductor substrate, a light detection element configured to be formed over the flip-chip semiconductor substrate and to have a laminate structure including a first semiconductor layer of a first-conductive-type, a light-absorption layer formed over the first semiconductor layer, and a second semiconductor layer of a second-conductive-type formed over the light-absorption layer, an inductor configured to be connected to the light detection element over the flip-chip semiconductor substrate, an output electrode for bump connection configured to output a current generated by the light detection element through the inductor, a bias electrode for bump connection configured to apply a bias voltage to the light detection element through a bias electrode, and a line configured to cause a metal line of the inductor and the light detection element to be connected to the output electrode or the bias electrode.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 1A is a diagram illustrating a configuration of a general inductor using a diffusion conductive region of a semiconductor device.

FIG. 1B is a diagram illustrating a configuration of a general inductor using a diffusion conductive region of a semiconductor device.

FIG. 2 is a diagram illustrating a light receiver according to the present disclosure.

FIG. 5A is a diagram illustrating a method of fabricating the light-receiving device.

FIG. 5B is a diagram illustrating the method of fabricating the light-receiving device.

FIG. 5C is a diagram illustrating the method of fabricating the light-receiving device.

FIG. 5D is a diagram illustrating the method of fabricating the light-receiving device.

DESCRIPTION OF EMBODIMENTS

Figure 3A:
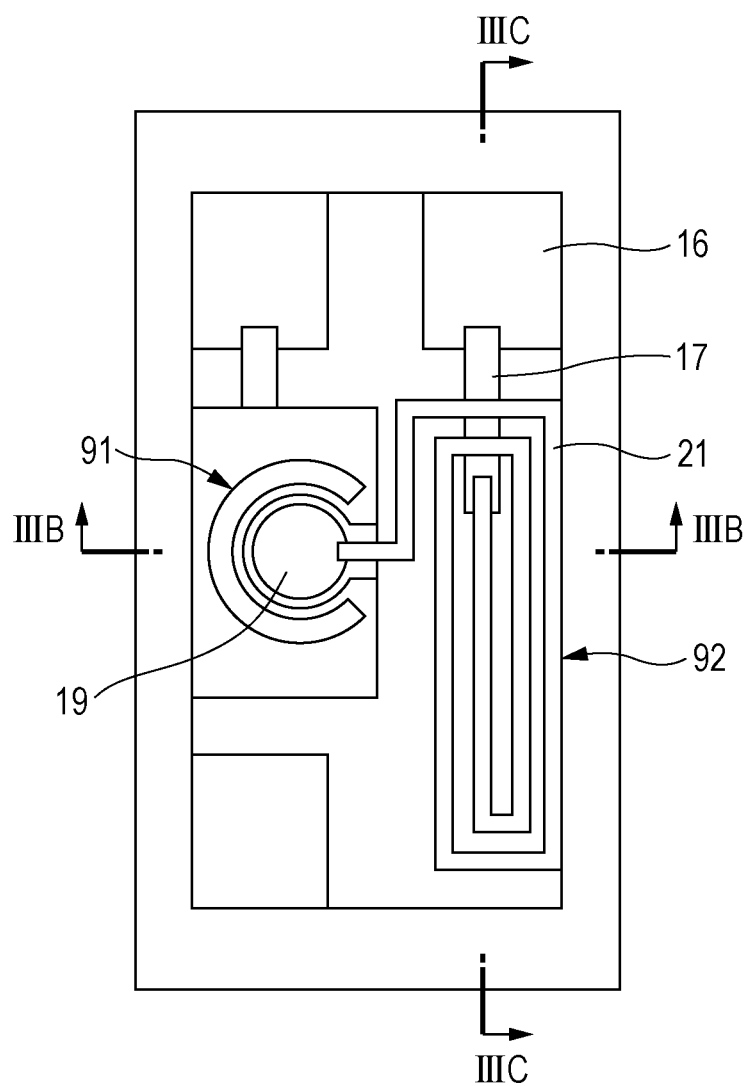
FIG. 3A is a diagram illustrating a configuration of a light-receiving device designed in a process of obtaining light-receiving devices according to embodiments.

FIG. 2 is a diagram schematically illustrating a light receiver 1 including a light-receiving device (a PD (photodiode) chip including an inductor) according to the present disclosure. The light receiver 1 is a digital coherent receiver, for example. The light receiver 1 includes a optical signal demodulator 2 which performs a demodulation process on optical multi-level phase shift keying signals supplied from optical transmission paths, an OE converter 3 which converts light signal components processed by the optical signal demodulator 2 into electric signals, an AD converter 4 which converts the analog electric signals obtained through the OE conversion into digital signals, and a digital signal processor (DSP) 5 which processes the digital signals.

The optical signal demodulator 2 and the OE converter 3 are collectively referred to as a light-reception frontend. The optical signal demodulator 2 separates polarization components which are orthogonal to each other from each other and phase components which are orthogonal to each other from each other using PBSs (Polarization Beam Splitters), an LO (Local Oscillator), and 90-degree optical hybrids included in the optical signal demodulator 2. The separated light signal components are detected by the OE converter 3 and converted into electric signals.

The OE converter 3 includes light-receiving devices 7-1 to 7-4 (which are collectively referred to as a "light-receiving device 7") including photodiodes (PDs) and includes trans-impedance amplifiers (TIAs) 8-1 to 8-4 (which are collectively referred to as a "TIA 8") which convert micro currents generated by the light-receiving devices 7-1 to 7-4 into voltages. The light-receiving device 7 and the TIA 8 are connected to each other through a transmission path.

The light signals which are subjected to the OE conversion are sampled in a given clock by corresponding analog/digital converters 4-1 to 4-4 included in the AD converter 4 and supplied as digital signals to the DSP 5. The DSP 5 demodulates the digital signals by performing waveform distortion correction, phase control, an adaptive equalizing process, and the like.

As described above, a chip included in the light-receiving device 7 and an IC chip included in the TIA 8 are implemented as flip-chip implementation and are connected to each other through the transmission path in the OE converter 3. However, an implementation of an inductor in the transmission path is difficult in terms of a space. Therefore, a light-receiving device which has a PD chip including an inductor will be proposed.

Figure 3B:
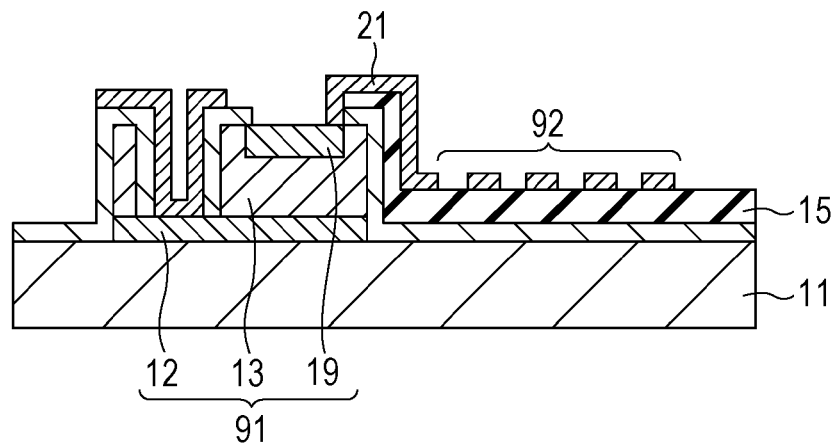
FIG. 3B is a sectional view taken along a line IIIB of FIG. 3A.
Figure 3C:
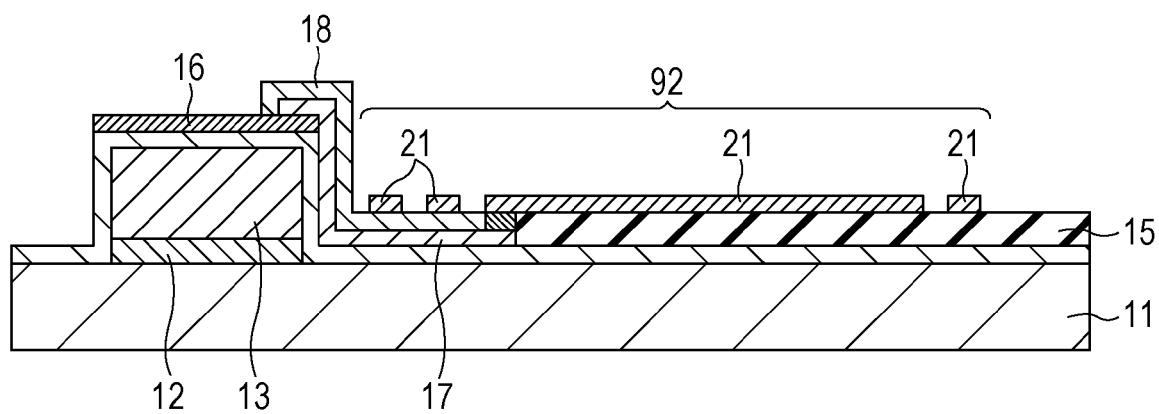
FIG. 3C is a sectional view taken along a line IIIC of FIG. 3A.

FIG. 3A is a diagram illustrating a light-receiving device 90 proposed in a process for realizing the PD chip including an inductor in a state in which a surface on which devices are to be formed faces upward. FIG. 3B is a sectional view taken along a line IIIB illustrated in FIG. 3A. FIG. 3C is a sectional view taken along a line IIIC illustrated in FIG. 3A. In the light-receiving device 90, a PD 91 and an inductor 92 which is formed by a metal line 21 having a spiral shape are formed over the same semiconductor substrate 11.

As illustrated in FIGS. 3A to 3C, the PD 91 includes an n-type semiconductor (conductive) layer 12 disposed on the semi-insulating semiconductor substrate 11, a light-absorption layer (i-type semiconductor layer) 13 disposed on the n-type semiconductor layer 12, and a p-type semiconductor region 19 disposed on the light-absorption layer 13. The n-type semiconductor layer 12 is removed below the metal line 21 included in the inductor 92 so that generation of parasitic capacitance is suppressed. The metal line 21 included in the inductor 92 formed over an insulation layer 15 is connected to an electrode pad 16 used for extracting current (for outputting current) through a metal line 17 formed over a lower layer.

With this configuration, the parasitic capacitance may be reduced. However, when the inductor 92 is to be formed in the chip, two layers, i.e., the metal line 17 serving as a line layer for connection and the metal line 21 serving as a line layer having a spiral shape are formed. Therefore, a fabrication process may be complicated. Accordingly, an inductor incorporated in a PD chip will be formed with ingenuity without complication of the fabrication process.

First Embodiment

Figure 4A:
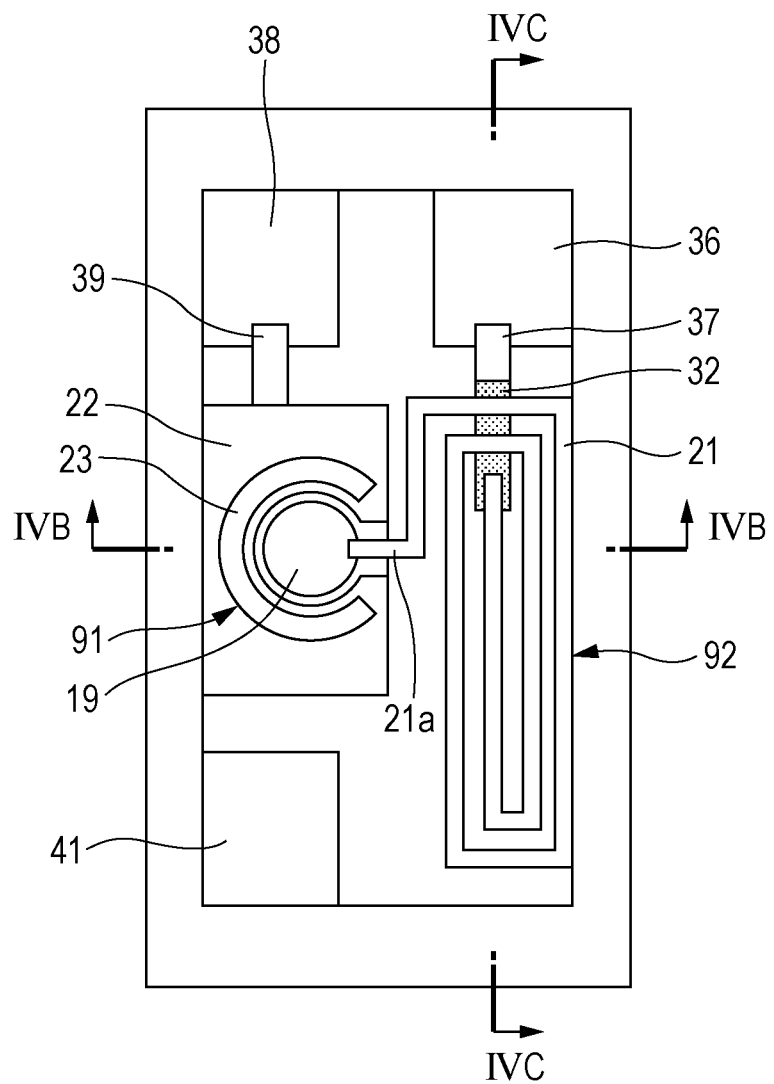
FIG. 4A is a diagram illustrating a configuration of a light-receiving device according to a first embodiment.
Figure 4B:
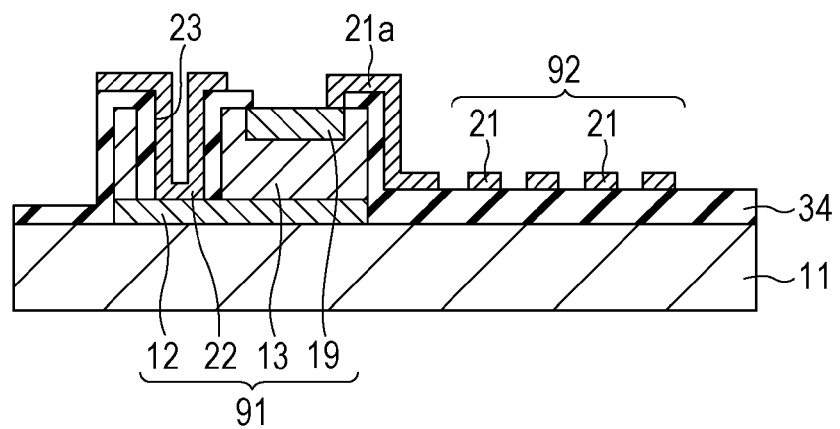
FIG. 4B is a sectional view taken along a line IVB of FIG. 4A.
Figure 4C:
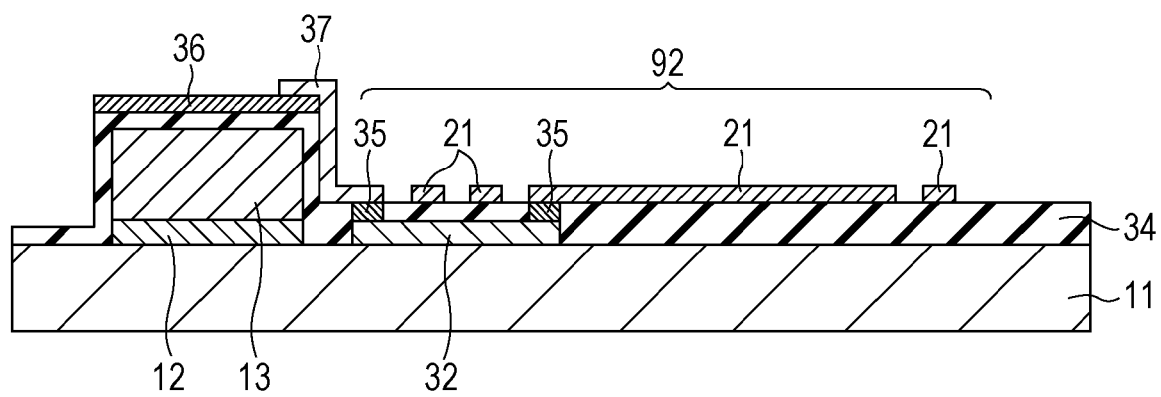
FIG. 4C is a sectional view taken along a line IVC of FIG. 4A.

FIG. 4A is a diagram illustrating a light-receiving device (a PD chip including an inductor) 10 according to a first embodiment in a state in which a surface on which the device is to be formed faces upward. FIG. 4B is a sectional view taken along a line IVB illustrated in FIG. 4A. FIG. 4C is a sectional view taken along a line IVC illustrated in FIG. 4A.

As illustrated in FIGS. 4A to 4C, the light-receiving device 10 includes a PD 91 serving as a light detection element formed over a semi-insulating semiconductor substrate 11 and an inductor 92 connected to the PD 91 on the semiconductor substrate 11. The inductor 92 is connected through an intersection line 32 to an output electrode pad 36 which outputs a current generated in the PD 91 and which outputs the current to circuits (including a TIA circuit) in later stages. Note that the intersection line 32 may be an n-type semiconductor (conductive) layer.

The inductor 92 includes a metal line 21 which has a spiral shape and which has one end connected to the PD 91 and the other end connected to the intersection line 32. The intersection line 32 is disposed in a layer in the same level as a first conductive semiconductor layer 12 included in the PD 91, and electrically connects the PD 91 and the electrode pad 36 to each other through the spiral-shaped metal line 21. In a description below, although the metal line 21 serving as an inductor line is referred to as a "spiral metal line 21" for convenience sake, a metal line 21 having another shape may be used.

In the configuration illustrated in FIG. 4B, the PD 91 includes the n-type semiconductor layer 12 disposed on the semi-insulating semiconductor substrate 11, a light-absorption layer 13 of an i-type semiconductor which is disposed on the n-type semiconductor layer 12, and a p-type semiconductor region 19 disposed on the light-absorption layer 13. The p-type semiconductor region 19 functions as a light-receiving surface.

As illustrated in FIG. 4C, the spiral metal line 21 included in the inductor 92 is connected to an output line 37 and the output electrode pad 36 through the intersection line 32 which is the n-type semiconductor conductive layer disposed in the same level as the n-type semiconductor layer 12 included in the PD 91.

Since the semiconductor conductive layer 32 passes below the metal line 21 and intersects with the metal line 21, the semiconductor conductive layer 32 is referred to as the "intersection line 32". The intersection line 32 is connected to one end of the metal line 21 and the output line 37 through contact via holes 35. The other end of the metal line 21 is connected to a p-side electrode 21a connected to the p-type semiconductor region 19 of the PD 91.

The light-receiving device 10 further includes a bias electrode pad 38 which applies a reverse bias to the PD 91 and includes a dummy electrode pad 41. The bias electrode pad 38 is connected to an n-side electrode 22 of the PD 91 through a connection line 39. The n-side electrode 22 is connected to the n-type semiconductor layer 12 through a contact hole 23 (refer to FIG. 4B).

The dummy electrode pad 41 does not have electrical connection and is in a floating state in terms of potential. The dummy electrode pad 41 has a height the same as those of the electrode pad 36 and the bias electrode pad 38 and is disposed in an opposite side of the side in which the electrode pad 36 and the bias electrode pad 38 are disposed. Since the dummy electrode pad 41 which has a ground potential or a floating potential is disposed, the light-receiving device 10 may be stably supported when the light-receiving device 10 is implemented as flip-chip implementation.

With this configuration, the intersection line 32 may be disposed using a semiconductor conductive layer included in the n-type semiconductor layer 12 of the PD 91. Therefore, metal line layers in two layers cannot be formed. Furthermore, since the intersection line 32 merely extends in a direction in which the intersection line 32 intersects with the spiral metal line 21 in a small number of portions on the semi-insulating semiconductor substrate 11, parasitic capacitance below the metal line 21 may be reduced to a negligible degree.

FIGS. 5A to 5D are diagrams illustrating a process of fabricating the light-receiving device 10. As illustrated in FIG. 5A, the n-type semiconductor layer 12 and an i-type semiconductor layer serving as the light-absorption layer 13 are formed over the semi-insulating semiconductor substrate 11 by crystal growth using an MBE method, an MOCVD method, or the like. A semi-insulating InP substrate serves as the semi-insulating semiconductor substrate 11, for example. The n-type semiconductor layer 12 is formed by an InGaAsP layer which is subjected to n-type doping, for example, and has a thickness of 0.5 to 1.0 µm, for example. The light-absorption layer 13 is formed by an n-type InGaAs layer having a impurity concentration lower than that of the n-type semiconductor layer 12 and has a thickness of 1.5 to 3.0 µm, for example. In the light-absorption layer 13, the p-type semiconductor region 19 serving as a light-receiving unit is formed. The p-type semiconductor region 19 may be formed by metallic diffusion, for example. Specifically, a dopant metallic thin film of Zn, for example, is formed by resistance heating deposition or a spattering method and is subjected to heat diffusion so that the p-type semiconductor region 19 is formed. The p-type semiconductor region 19 may be formed by crystal growth instead of the metallic diffusion. The p-type semiconductor region 19 has a depth of 0.5 to 1.0 µm, for example.

Next, as illustrated in FIG. 5B, unused layers are removed by etching except for regions corresponding to the p-type semiconductor region 19 serving as the light-receiving unit, the electrode pads 36 and 38, and the dummy electrode pad 41 so that a mesa configuration is formed. In this etching process, a portion of the n-type semiconductor layer 12 is used as the intersection line 32 of the inductor 92. Accordingly, when the etching is performed, in addition to the PD mesa region, a certain portion of the n-type semiconductor layer 12 is left as the intersection line 32.

More specifically, a first etching mask of an SiN, for example, is formed in a portion to remain as a mesa configuration, and the light-absorption layer 13 in a portion to be exposed is removed by etching. The etching may be performed by a wet process or a dry process. When wet etching is performed, etchant having an etching speed for the light-absorption layer 13 efficiently higher than an etching speed for the n-type semiconductor layer 12 is used. After unused portions of the light-absorption layer 13 are removed and the first etching mask is removed, a second etching mask of an SiN, for example, is formed in a portion in which the mesa configuration and the intersection line 32 are to be formed. Using the second etching mask, the n-type semiconductor layer 12 is processed in a given shape by etching. By this, the intersection line 32 is formed in the same layer as the n-type semiconductor layer 12 of the PD 91 by the same process.

Next, as illustrated in FIG. 5C, after an insulating film 34 is formed over the entire semi-insulating semiconductor substrate 11 by the spattering method or the like, a contact hole 23 used for electrical contact with the n-type semiconductor layer 12 and a contact hole 45 used for electrical contact with the intersection line 32 are formed by etching.

Next, as illustrated in FIG. 5D, a metal line such as a gold (Au) metal line or a copper (Cu) metal line is formed by the resistance heating deposition or the sputtering method. In this case, an appropriate wiring pattern may be formed using a heating deposition mask or a sputtering mask which has a given opening pattern or may be formed by a liftoff process. Specifically, the contact via holes 35 which reach the intersection line 32, the spiral metal line 21, the n-side electrode 22 of the PD 91, a p-side electrode 21a, the output electrode pad 36, and the output line 37 are formed. Furthermore, although not illustrated, the bias electrode pad 38 and the dummy electrode pad 41 (refer to FIG. 4) are formed in the same process.

The spiral metal line 21 may be formed so as to have a line width of approximately 10 to 50 µm, and a length of approximately 0.2 to 1.5 mm. When the inductor 92 is formed by the spiral metal line 21 having a width of 25 µm and a length of 0.5 mm, an inductance of the inductor 92 is approximately 0.5 nH.

According to the fabrication process described above, the intersection line 32 of the inductor may be formed in the semiconductor conductive layer by making use of the processing process of the mesa configuration for the PD and the mesa configuration for the electrode pads. Thereafter, the metal line 21 is formed in a metal line process. Accordingly, the inductor 92 is formed without additional processes. Note that only one metal layer may be formed. Furthermore, since the n-type semiconductor layer below the inductor 92 is entirely removed except for a region corresponding to the intersection line 32, generation of parasitic capacitance below the metal line 21 may be suppressed.

Figure 6:
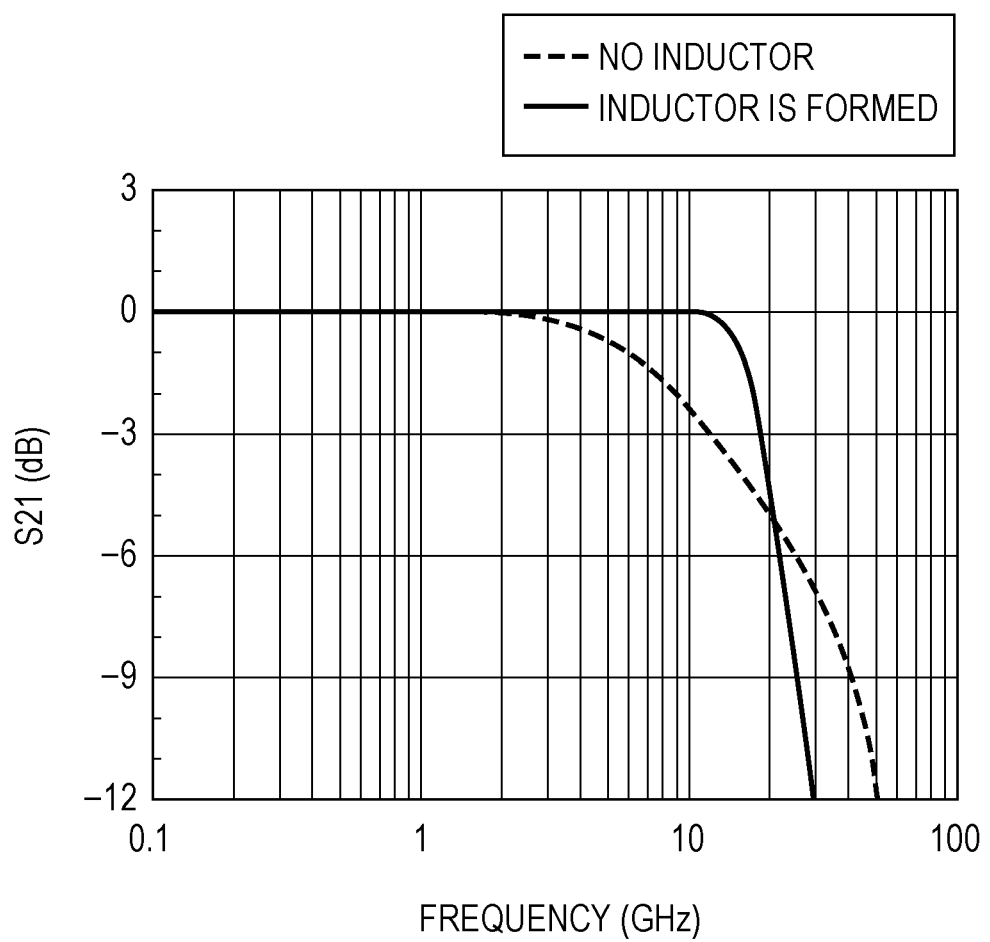
FIG. 6 is a graph illustrating an advantage of the light-receiving device.

FIG. 6 is a graph illustrating an effect of the light receiving device of this embodiment. In this graph, a result of simulation in a case where an inductor (0.5 nH) having an entire length of 0.5 mm is formed over a chip having a large light-receiving diameter PD (having a light-receiving diameter of 60 μm and capacitance of 250 fF) is represented by a solid line. On the other hand, a result of simulation of a PD chip formed in the same condition except that an inductor is not formed is represented by a dotted line. Frequency bands in a position in which a high frequency characteristic (S21) is reduced by 3 dB (referred to as a "3-dB band" for convenience sake) are compared with each other. When the inductor is provided, the 3-dB band may be expanded to approximately 20 GHz. That is, the bandwidth is expanded by 50%.

As described above, the band of the large light-receiving diameter PD may be expanded by a process the same as that of the general PD fabrication process, and high-speed reception of the reception unit in the optical interconnect may be realized.

Figure 7:
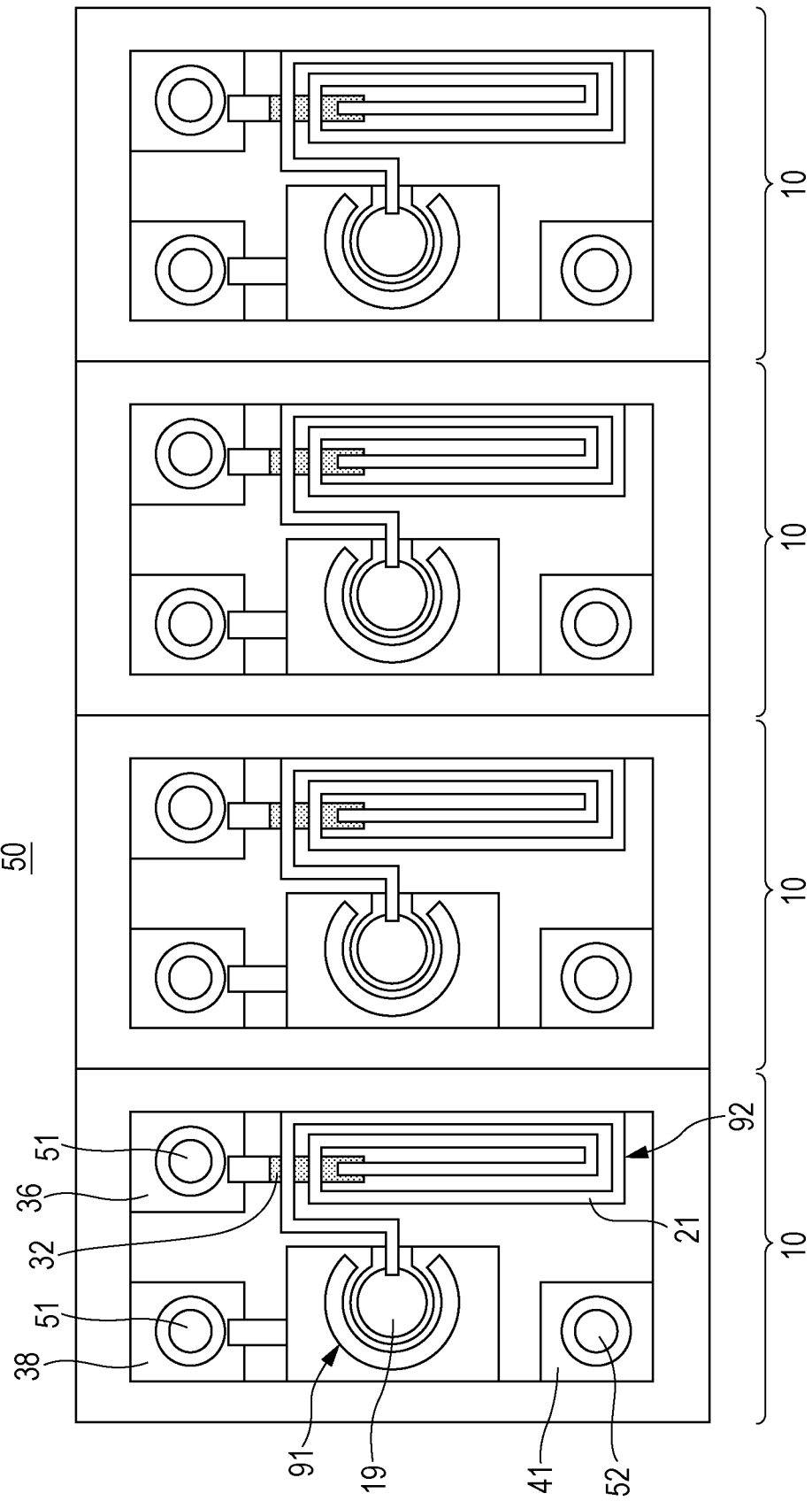
FIG. 7 is a diagram schematically illustrating a PD array chip including the light-receiving devices according to the first embodiment.

FIG. 7 is a diagram schematically illustrating a PD array chip 50 including a plurality of light-receiving devices 10 according to the first embodiment. The PD array chip 50 is fabricated by connecting a desired number of light-receiving devices (PD chips including inductors) 10 which are formed over wafers, not illustrated, to one another and outputting the connected light-receiving devices 10. In this example, four light-receiving devices (PD chips) 10 are aligned so as to form the four-channel PD array chip 50.

Each of the light-receiving devices 10 includes the PD 91, the inductor 92 connected to the PD 91, and the intersection line 32 which intersects with the inductor 92. The inductor 92 includes the metal line 21 having one end connected to the PD 91 and the other end connected to the intersection line 32. The intersection line 32 is formed in the same layer as a first conductive semiconductor layer of the PD 91. Each of the light-receiving devices 10 includes the bias electrode pad 38 which outputs current generated in the PD 91 through the metal line 21 and the intersection line 32 and applies a reverse bias to the output electrode pad 36 and the PD 91 and includes the dummy electrode pad 41. On the output electrode pad 36 and the bias electrode pad 38, bumps 51 for flip-chip implementation are formed. On the dummy electrode pad 41, a dummy bump 52 is formed. The bumps 51 and the dummy bump 52 are Au stud bumps having bump diameters of 40 to 60 μm and bump heights of 5 to 20 μm, for example. Since the PD array chip 50 which incorporates the inductors is implemented as the flip-chip implementation, a large-band OE converter having a large light-receiving diameter may be realized in the light receiving frontend.

Figure 8:
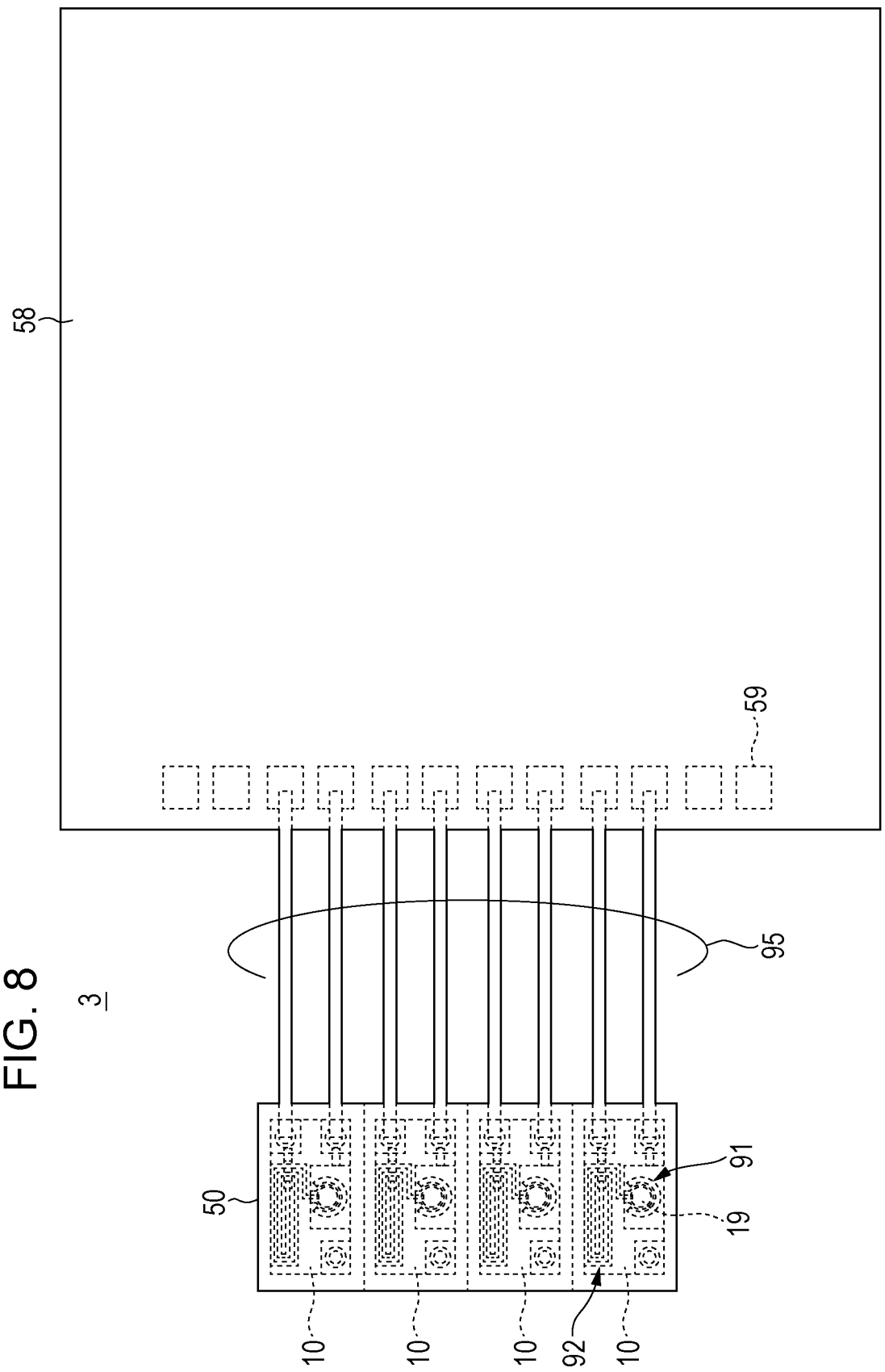
FIG. 8 is a diagram schematically illustrating an OE converter using the PD array chip illustrated in FIG. 7.

FIG. 8 is a diagram schematically illustrating the OE converter 3 using the PD array chip 50 illustrated in FIG. 7. The PD array chip 50 and a TIA chip (current/voltage conversion circuit) 58 are implemented as flip-chip implementation on a circuit substrate, not illustrated. Optical waveguides which extend from the optical signal demodulator 2 illustrated in FIG. 2 are disposed so as to have end faces which face light-receiving units (p-type semiconductor regions) 19 of the light-receiving devices 10 included in the PD array chip 50 (although not illustrated in FIG. 8). Light signals transmitted through optical fibers are supplied to the PDs 91 to which the reverse bias is applied and converted into optical currents.

The PD array chip 50 and the TIA chip 58 are connected to each other through a transmission path 95 disposed on the circuit substrate. A bump pitch between the Au stud bumps 51 of the PD array chip 50 (refer to FIG. 7) is 125 μm, for example, a PD channel pitch is 250 μm, for example. The TIA chip 58 has a plurality of TIA pads 59 on a side facing the PD array chip 50. The TIA pad pitch is 125 μm, for example. The TIA chip 58 is formed as an IC circuit. Although not illustrated, the TIA chip 58 also includes a trans-impedance amplifier, a bias voltage generation circuit, and the like disposed thereon.

Although physical spaces in which inductors may be formed are not ensured in the transmission path 95 which connects the PD array chip 50 and the TIA chip 58 to each other, the inductors 92 are formed in the light-receiving devices 10 included in the PD array chip 50. Accordingly, high-frequency signals which are received by the PDs 91 having large light-receiving diameters and which are converted into currents are supplied to the TIA pads 59 without deterioration of frequency band characteristics.

Note that, when the light-detecting device (PD) 91 is formed as a balanced photodiode as illustrated in FIG. 2, the following configuration may be realized. That is, a pair of photodiodes which are the same as the PD 91 is formed. Then a reverse bias is applied to an n-side electrode of one of the PDs so that a current is output from a p-side electrode, and a reverse bias is applied to a p-side electrode of the other PD so that a current is output from an n-side electrode. Thereafter, a difference between the currents which are output from the PDs and which pass respective inductors is output to the electrode pad 36. Also in this case, end portions on electrode sides of the spiral metal lines 21 included in the inductors 92 are connected to the output electrode pads 36 through the semiconductor conductive layers (intersection lines) 32 formed in the same layer as the n-type semiconductor layers 12 of the PDs 91.

Second Embodiment

Figure 9:
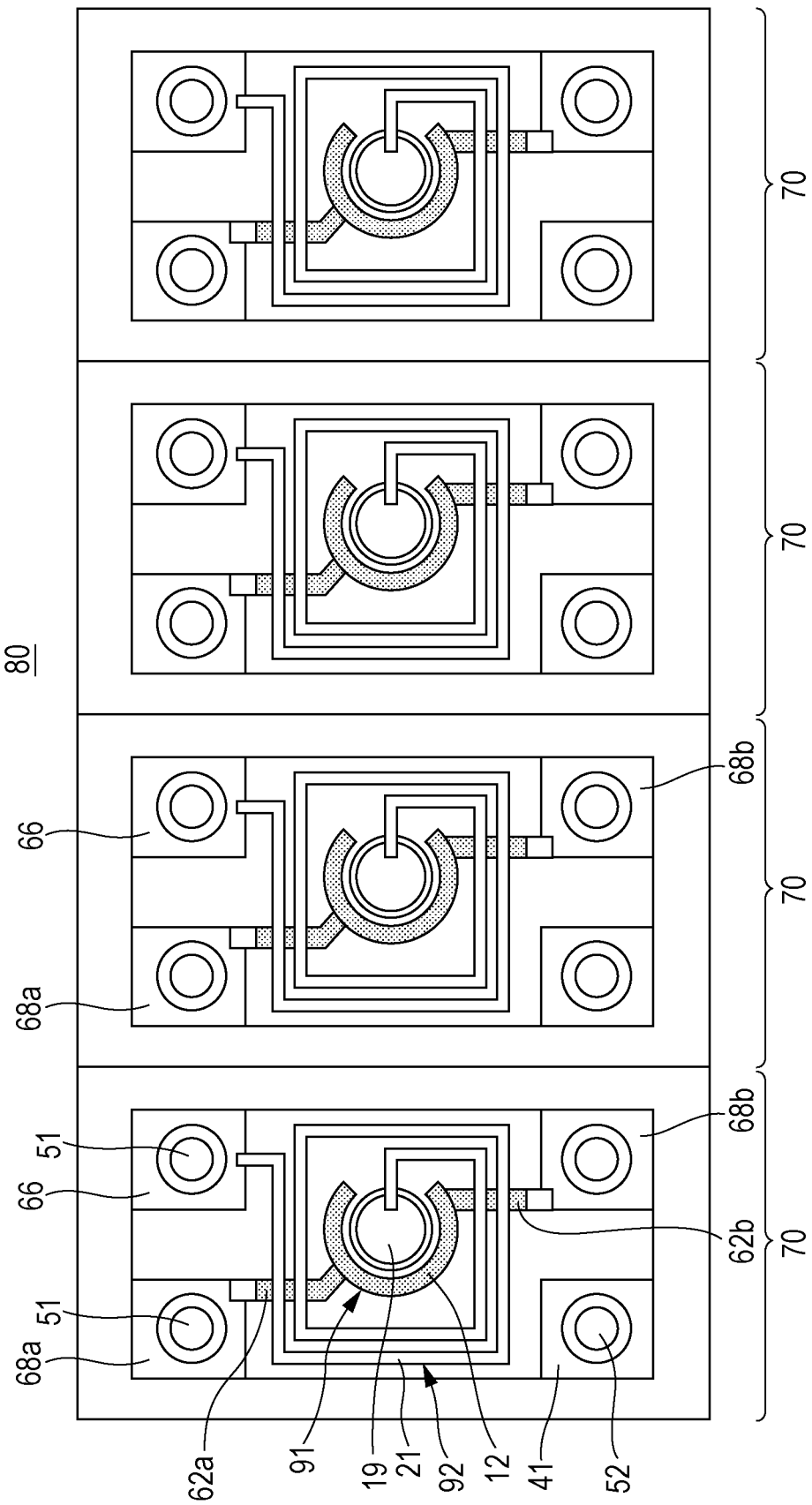
FIG. 9 is a diagram illustrating a PD array chip according to a second embodiment.

FIG. 9 is a diagram illustrating a PD array chip 80 according to a second embodiment. In the second embodiment, light-receiving devices 70 included in the PD array chip 80 have respective intersection lines 62a which connect respective PDs 91 and respective cathode electrodes (bias electrode pads) 68a to each other and have respective intersection lines 62b which connect the respective PDs 91 and respective cathode electrodes (bias electrode pads) 68b to each other.

Specifically, each of the light-receiving devices 70 includes the PD 91 serving as a light-detecting device, an inductor 92 connected to a p-type semiconductor region 19 of the PD 91, an output electrode pad 66 which outputs a current generated in the PD 91 through the inductor 92, the bias electrode pads 68a and 68b which apply bias voltages to the PD 91, the intersection line 62a which connects the PD 91 and the bias electrode pad 68a to each other, and the intersection line 62b which connects the PD 91 and the bias electrode pad 68b to each other.

In this example, an n-type semiconductor layer 12 (only a portion of the n-type semiconductor layer 12 is illustrated in FIG. 9) included in the PD 91 is connected to the intersection lines 62a and 62b disposed in the same layer as the n-type semiconductor layer 12. The intersection lines 62a and 62b are connected to the bias electrode pads 68a and 68b, respectively. As with the first embodiment, insulation layers are disposed between the intersection lines 62a and 62b and the metal line 21 of the inductor 92.

As has been described with reference to FIG. 5B, this configuration is realized by removing regions other than the n-type semiconductor layer 12 (refer to FIG. 4B) and the intersection lines 62a and 62b of the n-type semiconductor layer formed over an entire semi-insulating semiconductor substrate 11 by etching. Accordingly, the general PD fabrication process may be employed without additional operations.

The bias electrode pads 68a and 68b are diagonally disposed on the light-receiving devices 70. In a practical use, any one of the bias electrode pads 68a and 68b may be used in accordance with wiring layout of a product or circuit layout. In this way, a degree of freedom of usage is improved.

Furthermore, the light-receiving devices 70 includes a dummy electrode pad 41 similarly to the configuration illustrated in FIG. 7. On the electrode pads 41, 66, 68a, and 68b, respective bumps (such as Au stud bumps) 51 used for flip-chip bonding are formed. With this configuration, since the electrode pads (including the dummy electrode pad 41) having the same heights are arranged at the four corners of each of the light-receiving devices 70, stability of the flip-chip bonding is further improved.

Figure 10A:
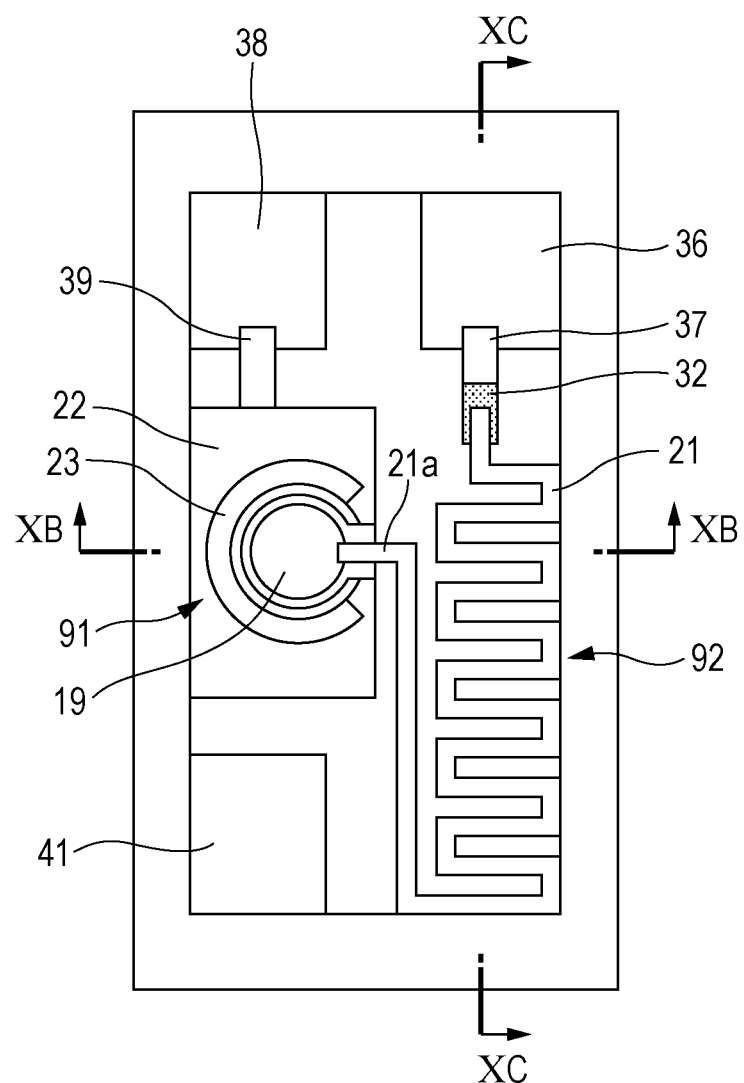
FIGS. 10A to 10C are diagrams illustrating modifications of the light-receiving device illustrated in FIGS. 4A to 4C.
Figure 10B:
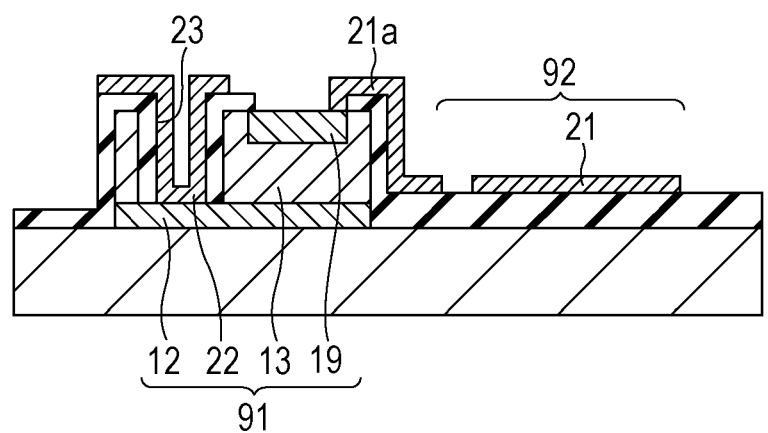
Figure 10C:
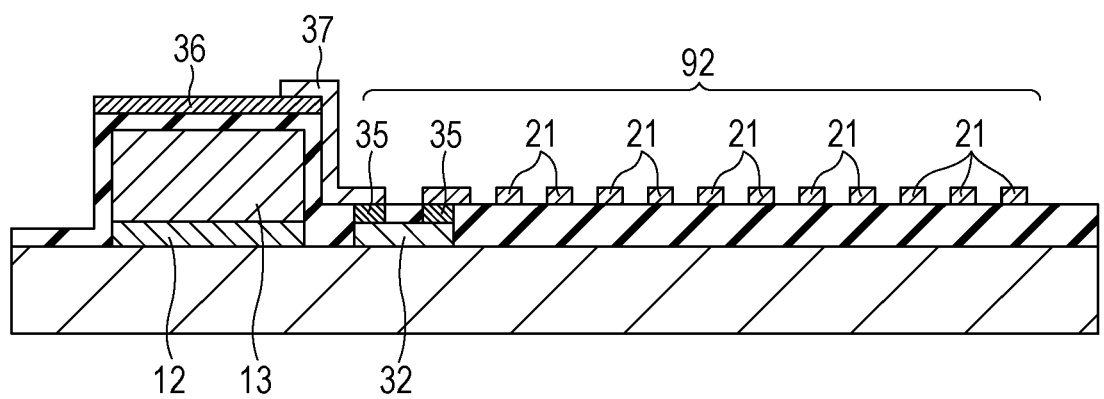

FIGS. 10A to 10C are diagrams illustrating modifications of the light-receiving device illustrated in FIGS. 4A to 4C. The light-receiving device illustrated in FIGS. 10A to 10C is different from that in FIGS. 4A to 4C in that an inductor has a shape formed by bending a line one or more times instead of a spiral shape. With this shape, vertical overlapping of lines may be avoided as illustrated in FIGS. 4A to 4C. Furthermore, as illustrated in FIGS. 4A to 4C, an electrode disposed on a flip-chip semiconductor substrate is connected to the inductor through an intersection line 32. Note that the intersection line 32 may be formed by an n-type semiconductor (conductive) layer.

As described above, according to the configurations of the first and second embodiments, an intersection line which intersects with an inductor so as to connect a PD and an electrode pad to each other may be formed over a semiconductor conductive layer making use of a process of forming a mesa configuration of the PD without changing a PD fabrication process and without adding another operation to the PD fabrication process. Accordingly, a metal line layer including a spiral metal line 21 of an inductor 92, a p-side electrode and an n-electrode of a PD 91, and the electrode pads may be formed in a single layer.

In the foregoing embodiments, the present disclosure is not limited to the foregoing embodiments, and various modifications may be made. For example, an undoped SiGe substrate may be used instead of an InP substrate. InAlAs material or InAlGaAs material may be used as a semiconductor layer. Moreover, an avalanche photodiode may be used instead of an PIN diode (p-intrinsic-n diode).

Furthermore, although the inductors have been described taking a spiral metal line as an example in the first embodiment, the shape of the inductor is not limited to the spiral shape, and an arbitrary inductor line having a line intersection portion may be employed.

Moreover, the first and second embodiments may be combined with each other, and a light-receiving device may include both of the intersection lines, i.e., the intersection line 32 which intersects with the inductor 92 and which connects the PD 91 and the output electrode pad to each other and the intersection line 62 which intersects with the inductor 92 and which connects the PD 91 and the bias electrode pad to each other.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:
1. A light receiver, comprising:
   at least one light-receiving device, including:
      a flip-chip semiconductor substrate,
      a light detection element configured to be formed over the flip-chip semiconductor substrate and to have a laminate structure including a first-conductive-type first semiconductor layer, a light-absorption layer formed over the first semiconductor layer, and a-second-conductive-type second semiconductor layer formed over the light-absorption layer,
      an inductor configured to be connected over the light detection element on the flip-chip semiconductor substrate,
      an output electrode for bump connection configured to output a current generated by the light detection element through the inductor,
      a bias electrode for bump connection configured to apply a bias voltage to the light detection element through a bias electrode, and
      a line configured to cause a metal line of the inductor and the light detection element to be connected to the output electrode or the bias electrode;
   an optical signal demodulator configured to demodulate a demodulation process on a light signal supplied from an optical transmission path;
   a photoelectric converter configured to convert a light signal component obtained through the light signal process into an electric signal using the light-receiving device;
   a digital converter configured to convert the electric signal obtained through the photoelectric conversion into a digital signal; and
   a digital signal processor configured to process the digital signal.
2. The light receiver according to claim 1, wherein the at least one light-receiving device includes a plurality of light-receiving devices, and the light receiver further comprises:
   an array chip on which the plurality of light receiving devices are aligned; and
   a current/voltage conversion circuit configured to be connected to the array chip.

* * * * *